(12) United States Patent
Yializis et al.

(10) Patent No.: US 7,781,034 B2
(45) Date of Patent: Aug. 24, 2010

(54) COMPOSITE MODULAR BARRIER STRUCTURES AND PACKAGES

(75) Inventors: Angelo Yializis, Tucson, AZ (US); Michael G. Mikhael, Tucson, AZ (US)

(73) Assignee: Sigma Laboratories of Arizona, LLC, Tucson, AZ (US)

( * ) Notice: Subject to any disclaimer, the term of this patent is extended or adjusted under 35 U.S.C. 154(b) by 273 days.

(21) Appl. No.: 10/838,701

(22) Filed: May 4, 2004

(65) Prior Publication Data

US 2005/0249901 A1 Nov. 10, 2005

(51) Int. Cl.
*B32B 27/00* (2006.01)
*B32B 27/08* (2006.01)
*B32B 9/00* (2006.01)
*B32B 9/04* (2006.01)
*B32B 17/06* (2006.01)

(52) U.S. Cl. .................. 428/34.7; 428/35.2; 428/35.7; 428/36.4; 428/36.6; 428/36.7; 428/411.1; 428/412; 428/421; 428/423.1; 428/425.5; 428/425.6; 428/426; 428/451; 428/457; 428/474.4; 428/480; 428/500; 428/532; 428/688; 977/712; 977/715; 977/779

(58) Field of Classification Search ................ 428/34.1, 428/34.4, 34.6, 34.7, 35.7, 36.4, 36.6, 36.7, 428/411.1, 421, 426, 474.4, 480, 500, 532, 428/688, 412, 423.1, 457, 35.2, 425.5, 425.6, 428/451; 977/701, 712, 715, 778, 779, 783
See application file for complete search history.

(56) References Cited

U.S. PATENT DOCUMENTS 6,118,218 A 9/2000 Yializis et al.
6,596,843 B2 * 7/2003 Brunelle et al. ............. 528/486

* cited by examiner

*Primary Examiner*—Rena L Dye
*Assistant Examiner*—Walter B Aughenbaugh
(74) *Attorney, Agent, or Firm*—Antonio R. Durando

(57) ABSTRACT

A composite multi-layer barrier is produced by first vapor depositing a barrier under vacuum over a substrate and then depositing an additional barrier at atmospheric pressure in a preferably thermoplastic layer. The resulting multi-layer barrier is used to coat an article in a lamination process wherein the thermoplastic layer is fused onto itself and the surface of the article. The vacuum-deposited barrier may include of a first leveling polymer layer followed by an inorganic barrier material sputtered over the leveling layer and of an additional polymeric layer flash evaporated, deposited, and cured under vacuum. The thermoplastic polymeric layer is then deposited by extrusion, drawdown or roll coating at atmospheric pressure. The resulting multi-layer barrier may be stacked using the thermoplastic layer as bonding agent. Nano-particles may be included in the thermoplastic layer to improve barrier properties. A desiccant material may also be included or added as a separate layer.

69 Claims, 7 Drawing Sheets

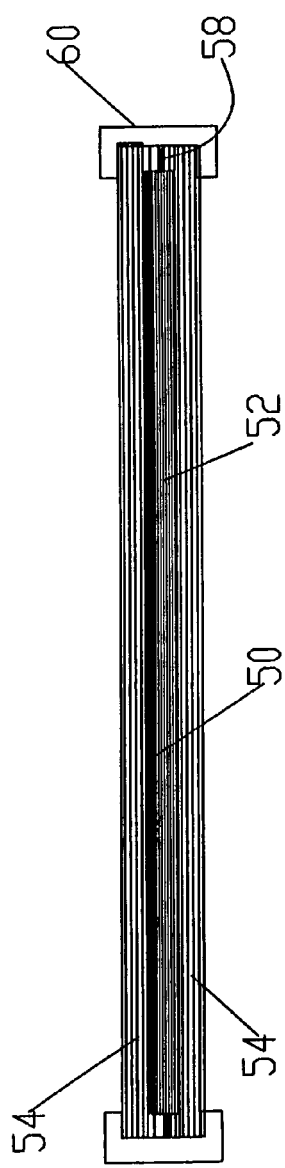
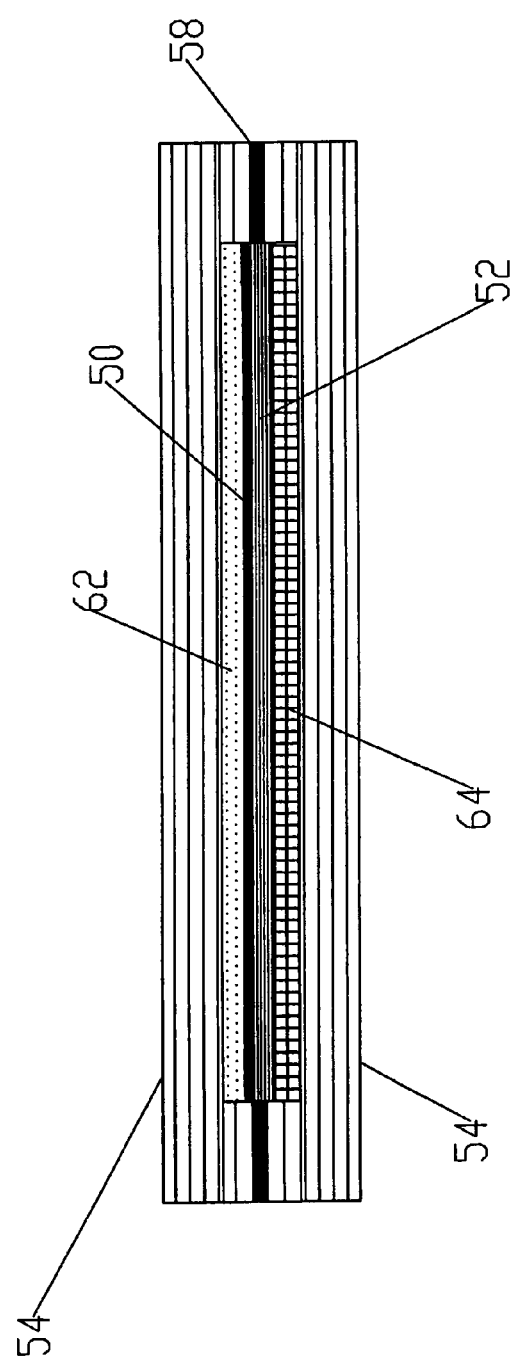
FIG. 9
FIG. 10

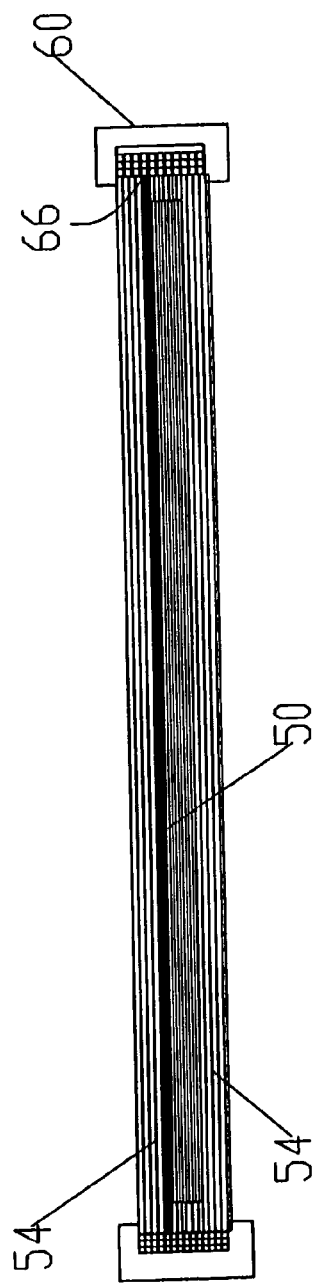
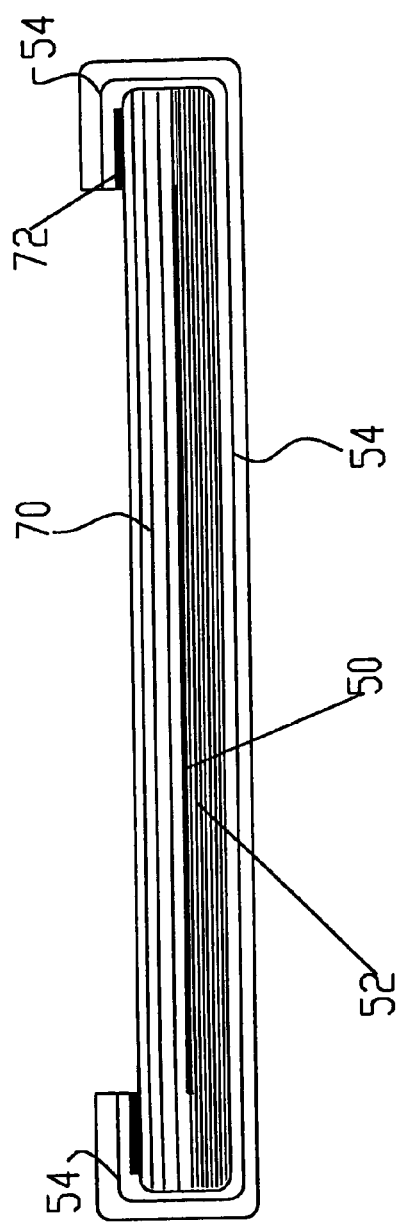
FIG. 11
FIG. 12

COMPOSITE MODULAR BARRIER STRUCTURES AND PACKAGES

BACKGROUND OF THE INVENTION

1. Field of the Invention

This invention is related in general to multi-layer transparent flexible barriers and to processes of manufacture for such barriers. In particular, the invention pertains to a composite barrier produced by vacuum as well as atmospheric deposition and a modular approach for using such a flexible barrier to produce transparent enclosures for encapsulating a flexible device with progressively higher levels of environmental protection.

2. Description of the Related Art

Inorganic and polymeric coatings deposited under vacuum or atmospheric conditions have been used for some time to promote desirable properties for particular applications. Multi-layer coatings of various combinations of materials have also been used to enhance the effectiveness of the coatings. Most notably, such coatings have been used successfully as barriers to moisture and oxygen permeability in packaging for foods and electronic devices.

Inorganic barrier layers consist of thin films of metals or ceramics (such as aluminum oxide, silicon oxide, indium tin oxide, etc.) deposited onto appropriate substrates by a variety of known processes, most notably by sputtering, chemical vapor deposition or physical vapor deposition. Organic polymeric barriers may be similarly produced by evaporating monomers or oligomers in vacuum, depositing the vapor to produce a film over a substrate, and curing the film to form a polymeric barrier. Inorganic and organic layers are often combined in multi-layer barriers to decrease permeability and/or add further functionalities to the barrier structure.

Flexible barriers may be transparent or opaque. Transparent barriers are used in applications where the product needs to be visible or where light must enter or exit the enclosed package. Such applications include, for example, food, medical and chemical packages, information displays, lights, and photovoltaic devices. Flexible transparent barriers utilize a combination of polymer layers with thin inorganic coatings that are transparent. Opaque barriers are used in packages where light transmission is not necessary. Opaque barriers are commonly produced using metal foils, such as aluminum, laminated with polymer layers.

Barriers have also been produced by mixing inorganic materials, such as metals, oxides and other ceramics, in a liquid monomer/oligomer and curing it to form a polymeric composite that is then used as a barrier material. In the case of a thermoplastic polymer, the material may be applied as a coating by a variety of application processes, such as extrusion, drawdown or roll coating, over the article of interest. Thermoset polymers, on the other hand, are first deposited as a layer over the article and then crosslinked to form the desired barrier.

As barrier coatings have increasingly become a normal part of manufacturing processes, the specifications for low permeability to oxygen and moisture have also become more and more stringent. That is particularly true in the evolving field of flexible displays, photovoltaic devices and flexible solid-state lights that utilize organic light emitting diodes and corrosion sensitive electrode systems where enclosures with very high barrier levels are required. Current flexible barrier designs focus on the use of specific single or multi-layer barrier structures that are deposited or laminated onto a device that is fabricated on a similar barrier sheet. However, device fabrication on a barrier layer imposes additional limitations to the barrier sheet properties, such as temperature and thermo-mechanical stability. Therefore, there is a continuing need for improved barrier structures that can be used to meet different performance specifications as needed in a commercial environment and for improved methods of producing device enclosures that are independent of or can withstand device manufacturing conditions.

BRIEF SUMMARY OF THE INVENTION

In view of the foregoing, the present invention consists of a flexible enclosure that is at least partially transparent and is designed to encapsulate a flexible electrical device that requires light transmission through at least part of the barrier walls of the enclosure. According to one aspect of the invention, a flexible device with electrical leads is encapsulated using two multi-layer barrier sheets that incorporate a thermoplastic layer or glue material. Each barrier sheet has a surface area larger than the device and is laminated onto the device and the other sheet on the back side of the device, thereby forming a protective enclosure that is transparent on at least one side of the device. The enclosure may also contain additional barrier reinforcement at the edges and a form of desiccant material to prolong the life of the enclosed device. In this manner, the barrier used to produce the packaging enclosure and the device are produced independent of each other. The device's electrical leads, which may be in the form of metalized or printed conductors on a flexible substrate, are allowed to exit on one or more sides of the enclosure.

Each composite barrier sheet may consist of one of several barrier structures that result in different levels of barrier performance. Such multi-layer structures may also be laminated onto themselves to produce different barrier sheets with much higher barrier properties than achievable with the single multi-layer structure.

In one such barrier structure, an inorganic transparent barrier layer is vacuum-deposited over a polymeric film substrate. A layer of thermoplastic polymer is then deposited by extrusion, drawdown or roll coating at atmospheric pressure over the vacuum-deposited layer to yield a multi-layer barrier according to the invention. This composite layer preferably also incorporates inorganic nano-particles or nano-flakes to further reduce its permeability without blocking light transmission in and out of the enclosure. The barrier also preferably incorporates a desiccant material either in the form of nano-particles, which may be included in the thermoplastic layer or may be in the form of a film attached to another layer, or as regular desiccant or water-retaining material otherwise encased in the package in a way that does not affect its transparency where required for the functionality of the enclosed device.

According to another aspect of the invention, the resulting composite barrier is stacked to form a thicker and progressively less permeable barrier either by repeating the deposition process in multiple passes or by fusing the single barrier structure into a stack using the thermoplastic nature of its last layer. This attribute of the composite barrier makes it possible to use the same product for multiple commercial applications having differing permeability specifications. Therefore, the composite barrier provides a flexibility of application heretofore unknown in the art.

In another embodiment of this barrier structure, an inorganic barrier layer is first deposited onto a polymeric substrate by vacuum deposition. A protective radiation-cured polymer layer is then deposited onto the inorganic barrier layer in vacuum and inline with the inorganic layer. A layer of thermoplastic polymer is then deposited over the thermoset polymer by extrusion, drawdown or roll coating at atmospheric pressure, preferably also incorporating inorganic nano-particles or nano-flakes to further reduce its permeability and/or absorb moisture. The layer of radiation-cured polymer protects the inorganic layer and acts to promote adhesion of the subsequent nano-composite layer.

In yet another embodiment of this barrier structure, a radiation-cured polymer layer is first deposited in vacuum prior to the deposition of the inorganic layer. This crosslinked layer is used to cover defects on the surface of the polymeric substrate, such as to block low molecular weight species (such as oligomers) that interfere with the nucleation and adhesion of the inorganic barrier layer. The remaining layers are then deposited according to either of the processes outlined above.

All of the barrier structures so described may be laminated onto a device or onto each other to form a barrier sheet that is then used to form the enclosure for a device or any article of manufacture. According to another aspect of the invention, transparent barrier sheets may be laminated with a metal-foil-based opaque barrier sheet on opposite sides of a device, thereby providing transparency on the side where it is required by the operation of the device while retaining the higher and less expensive barrier function of the opaque layer on the other side of the device. In such types of enclosure, the more flexible foil-based barrier sheet can be folded over the transparent barrier sheet to minimize gas and vapor transmission though the edges of the enclosure. An edge protector strip may be used to further protect the seal between barrier sheets.

According to yet another aspect of the invention, a composite nano-desiccant layer is produced by dispersing desiccant nano-particles in a transparent polymer binder, which may be the thermoplastic layer of the invention, thereby producing a highly water retaining and hydrophilic layer. The polymer nano-desiccant composite is then coated on the surface of the barrier sheet, thus forming a transparent layer that has very high moisture absorption properties. Alternatively, the desiccant nano-particles may be coated directly onto a barrier layer or may be applied to a support transparent resin layer which is added to the barrier sheet. A separate desiccant layer may also be placed between the barrier sheet and the device prior to the lamination process. Still alternatively, a transparent nano-desiccant layer may be coated on the barrier sheet inside the sealing area prior to the lamination process.

In all cases, the device enclosure produced according to the invention is evacuated prior to the sealing process to remove moisture. In addition, after the device is laminated between two barrier sheets, an edge guard strip with high barrier properties and desiccant features is preferably laminated or otherwise attached over the edges to provide added protection against oxygen and moisture infiltration.

Various other purposes and advantages of the invention will become clear from its description in the specification that follows and from the novel features particularly pointed out in the appended claims. Therefore, to the accomplishment of the objectives described above, this invention consists of the features hereinafter illustrated in the drawings, fully described in the detailed description of the preferred embodiment and particularly pointed out in the claims. However, such drawings and description disclose but one of the various ways in which the invention may be practiced.

BRIEF DESCRIPTION OF THE DRAWINGS

FIG. 9 is a schematic view of a device laminated with the stacked multi-layer structure of the invention wherein edge protector strips are used to encapsulate the package.

FIG. 10 is a schematic view of a device laminated with the stacked multi-layer structure of the invention wherein desiccant layers are added between the device and the laminating sheets.

FIG. 11 is a schematic view of the device of FIG. 9 wherein desiccant material is added within the edge protector strips.

FIG. 12 is a schematic view of a laminated device wherein the stacked multi-layer structure of the invention is used to frame and seal a conventional barrier on the transparent side of the device.

DESCRIPTION OF THE PREFERRED
EMBODIMENTS OF THE INVENTION

The invention lies in a new combination of barrier layers that is found to provide improved oxygen and moisture barrier performance and greater flexibility of application as a packaging cover over articles with different permeability specifications and transparency requirements. Rather than utilizing a different barrier and a different deposition process tailored to each product specification, the composite barrier of the invention may be used in modular fashion to achieve the desired level of performance for a multitude of package applications. As a result of the invention, articles that need a transparent package with different barrier requirements may be coated with the same process in different multiple-pass operations.

As used herein, "vacuum deposition" is intended to cover any deposition process wherein a substance is first vaporized under vacuum and then deposited as a thin-film layer over a cold substrate, which could be a web or film of a material with desirable characteristics intended to be incorporated into the final product, or a cold drum in the vapor deposition chamber. Such vacuum deposition processes include sputtering, reactive sputtering and physical vapor deposition as well as conventional flash evaporation. "Atmospheric deposition" is used primarily to refer to processes that do not involve the prior vaporization of the material being deposited, such as, without limitation, extrusion, drawdown or gravure roll coating, but it could also refer to vapor deposition processes carried out at atmospheric pressure, such as disclosed in U.S. Pat. No. 6,118,218. The term "monomer" is intended to also include oligomers suitable to practice the disclosed processes within the scope of the invention. The term "thin film" is intended to encompass any layer of material with a thickness in the order of microns or sub-microns, the thickness typically consisting of inorganic or polymeric films produced by vapor deposition processes. "Nano-particles" and "nano-flakes" are terms used to refer to particles of any shape having a nominal diameter in the order of a few hundred nanometers (less than one micron and smaller), and "nano-particles" is used to refer to both nano-particles and nano-flakes. "Nano-composite" layer is used to denote a resin layer containing nano-particles or a nano-particle layer applied to another layer in the composite structure of the invention. The term "desiccant" is used generically to refer to true desiccant materials, as understood in the art, as well as to water-retaining polymers and other water-retaining materials. The term "barrier" material refers to any material used to decrease water and/or oxygen permeability. Finally, nano-particles may consist of barrier material as well as desiccant material, as these have been defined herein.

Figure 1:
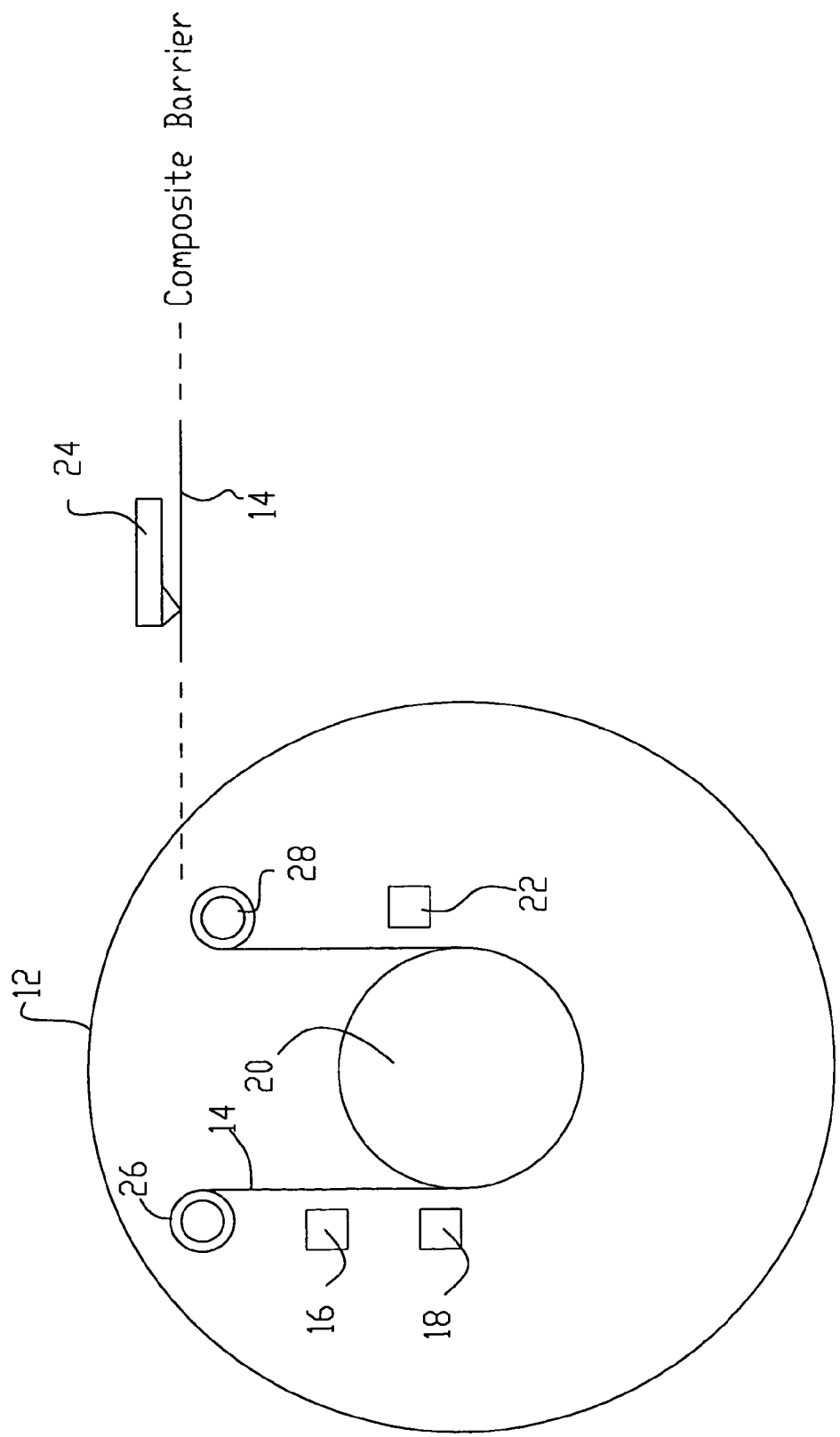
FIG. 1 is a schematic representation of a manufacturing apparatus combining a vacuum vapor deposition chamber with an atmospheric deposition unit to produce the composite barrier of the invention.

Referring to the figures, wherein like parts are identified with like reference numerals and symbols, FIG. 1 illustrates schematically a multi-layer deposition apparatus 10 for practicing the present invention. The apparatus consists of a conventional vacuum vapor-deposition chamber 12 wherein a web or film substrate 14 is passed to receive one or more layers of vapor deposited material. In the preferred embodiment of the invention, the substrate 14 is a polyester or polycarbonate film, with high transmittance and abrasion-resistance characteristics that render it suitable as a protective outer layer for packaging an article of manufacture. Depending on the particular barrier of interest, different conventional vapor deposition units are used in the vacuum chamber 12. For example, the substrate 14 may be passed through an inorganic deposition unit 16, such as a resistive evaporator, or a sputtering or electron beam evaporation unit, wherein a metal, metal oxide, or any other ceramic (transparent or not, depending on the requirements of the application) is deposited to form a thin barrier film (in the order of 100-1000 angstroms). The substrate may then be passed through a conventional flash-evaporation section 18, wherein a monomer, such as an acrylate monomer, is vaporized and deposited over the metallic or ceramic film as a liquid layer upon contact with a cold drum 20. The monomer is also deposited as a thin film about 0.1 to 1.0 micron in thickness. The monomer film is then cured by exposure to an electron-beam or ultraviolet radiation source 22. It is noted that this layer of crosslinked polymer, while preferred, is not necessary to practice the various aspects of the present invention.

According to the invention, the two-layer barrier so constructed is then removed from the vacuum chamber and, under atmospheric conditions, an additional layer of thermoplastic material is added over the vacuum-deposited polymeric film (or the inorganic film, if no polymeric film is deposited). This layer is deposited using an extrusion or equivalent process in a conventional atmospheric-deposition unit 24 combined with the vacuum chamber 12. This third layer is added to provide a mechanism for laminating the barrier over articles of interest and for stacking multiple barrier layers to improve the barrier characteristics of the final sheet to the desired specifications. To this end, the layer deposited at atmospheric pressure preferably consists of a vinyl polymeric resin in a thickness ranging from 5 to 100 microns.

Because the layer deposited at atmospheric pressure is not vaporized, it can be used as a carrier of particles that add desirable properties to the product. For example, metallic nano-particles or nano-flakes can be added advantageously to the thermoplastic layer to further reduce the permeability of the barrier to moisture and oxygen without affecting the atmospheric process of deposition of the resulting mixture over the multi-layer structure produced in the vacuum chamber. The nano-particles or flakes are mixed uniformly into the thermoplastic material (normally prior to its polymerization, although they could also be mixed in the heated polymer) and the polymer is deposited as a hot fluidized film to adhere over the acrylate vapor-deposited layer. In order to retain as much transparency as possible, it is preferred to limit the thickness of the resulting nano-composite layer to about 20 microns. Thus, a composite barrier structure is produced in a semi-continuous process wherein the substrate is first advanced from a feed roller 26 to a take-up roller 28, and then it is passed through an atmospheric deposition unit 24 to yield the multi-layer barrier structure of the invention.

Figure 2:
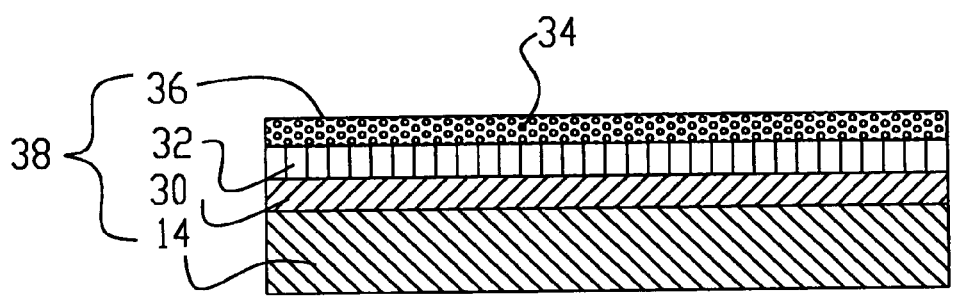
FIG. 2 is a schematic view of the multi-layer structure of a composite barrier according to the invention.
Figure 3:
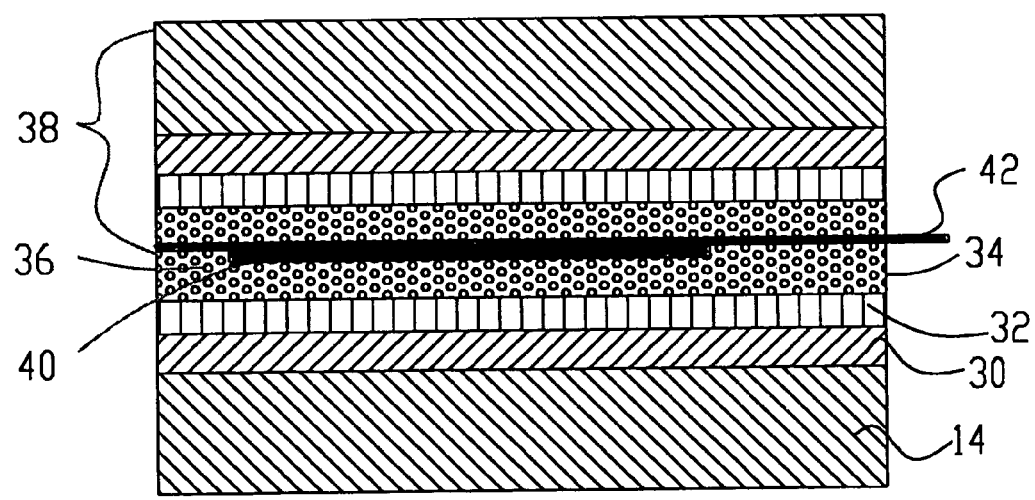
FIG. 3 is a schematic view illustrating a device sandwiched between two barrier sheets of the multi-layer structure of FIG. 2.
Figure 4:
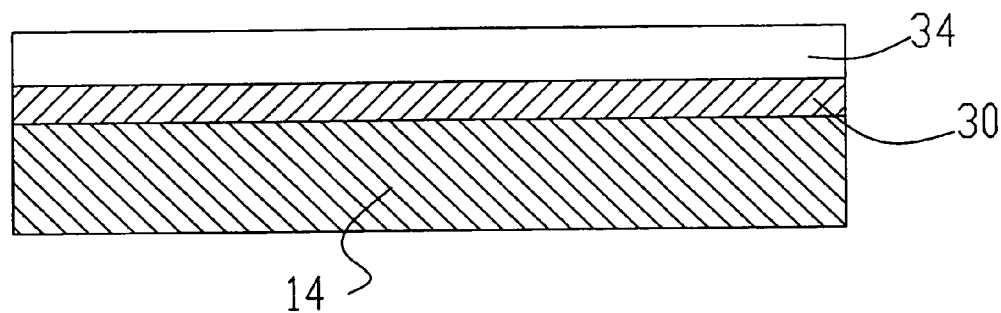
FIG. 4 is a schematic view of another multi-layer structure according to the invention wherein the thermoplastic layer is shown without nano-particles.
Figure 5:
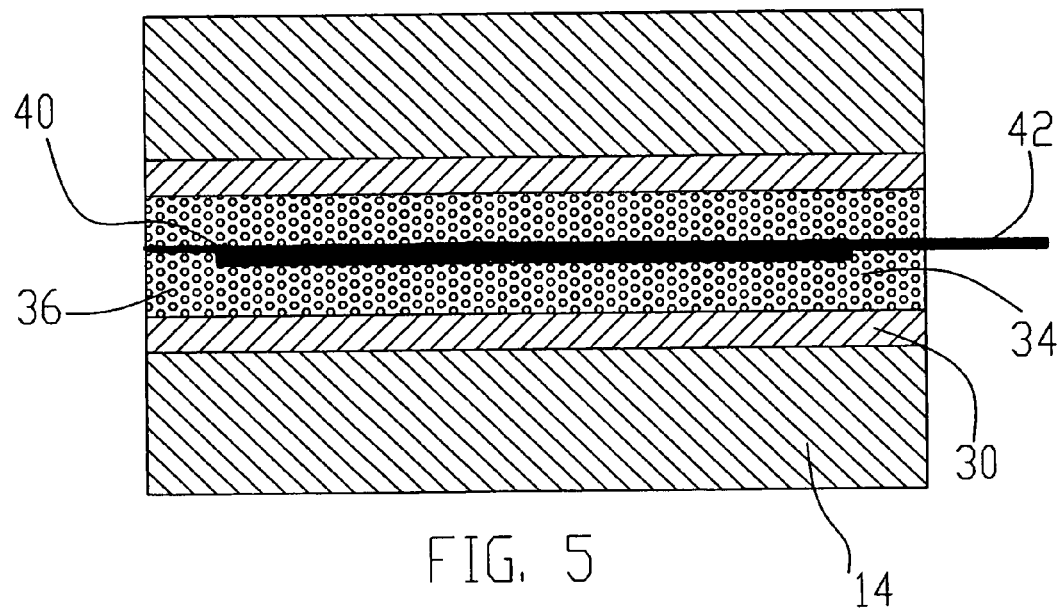
FIG. 5 is a schematic view illustrating a device sandwiched between two barrier sheets of the multi-layer structure of FIG. 4 wherein nano-particles have been added to the thermoplastic layer.

FIG. 2 illustrates the multi-layer barrier resulting from the dual deposition process described in FIG. 1. It is noted that all layers are shown in the figures for illustration purposes only in thicknesses that are necessarily disproportionate to their actual dimensions. The thin film of metallic barrier 30 is sandwiched between the substrate film 14 and the polymer thin film 32. The thicker thermoplastic layer 34 containing uniformly distributed nano-particles 36 completes the structure in the form of a multi-layer sheet 38 in roll form. This sheet product can then be used to laminate articles of manufacture, such as electronic components, photovoltaic devices, batteries, organic light emitting diodes (OLEDs), displays etc., simply by adhering the thermoplastic layer 34 to the surface of the article, as illustrated in FIG. 3. In addition, the nano-particles or nano-flakes embedded in the thermoplastic layer provide an additional barrier to oxygen and moisture permeability which has been found to improve the performance of conventional barriers to a greater extent than expected while retaining up to 90 percent of the transparency of the thermoplastic layer. Thus, the addition of the thermoplastic layer 34 to the vacuum-deposited barrier layers 30,32 provides the dual advantage of a barrier product that is suitable for lamination without the use of glues and is substantially improved in its permeability-barrier performance while remaining suitable for applications that require transparency. FIG. 4 illustrates the same type barrier wherein the thermoplastic layer (without nano-particles) is deposited directly over the inorganic layer for lamination purposes. FIG. 5 shows the same barrier with the addition of nano-particles and laminated over a device 40 with electrical leads 42 protruding from the barrier material for connection to a receiving apparatus.

Figure 6:
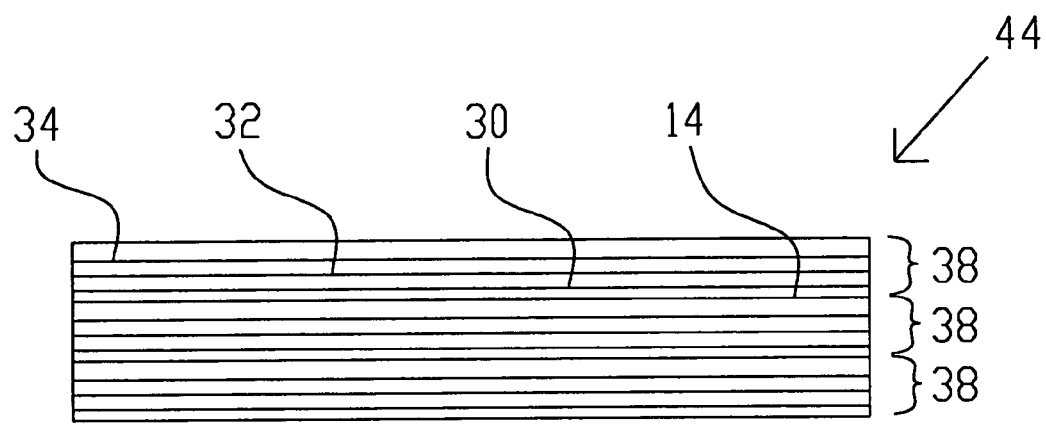
FIG. 6 is a schematic view of a stacked multi-layer structure of the composite barriers of the invention.

Another advantage of the barriers of the invention is that they can be readily stacked in multiple composite-barrier layers to reduce permeability essentially to any degree needed for a particular application. It has been found that each additional layer of a barrier such as illustrated in FIGS. 2 and 4 produces a comparable and predictable reduction in permeability both to oxygen and moisture. For example, each subsequent layer produces about the same percentage reduction or a progressively reduced percentage of reduction that can be empirically quantified and used as a predictor of performance in a stacked barrier. These properties can be used advantageously to reduce the cumulative permeability to essentially any desired specification. FIG. 6 illustrates a three-layer stack 44 of such a barrier product. (A darker layer is used to illustrate the structural adhesion between layers.) It is noted that because of the presence of a thermoplastic layer 34 in the stack 44, it can be still laminated to an article of manufacture as described above.

The substrate layer 14, which is intended to constitute the outer layer in a laminated product, is selected according the properties desired for each specific application. For example, if transmittance is important, the substrate may consist of an optical grade polyester or polycarbonate; if thermal stability is important, the substrate may be heat resistant arylite or polycarbonate; etc., as one skilled in the art would readily understand. In general, the substrate is selected, without limitation, from polyesters, polycarbonates, polyarylites, polyphenylene sulfides, polycycloaliphatics, polyacrylates, polystyrenes, polyurethanes, polyolefins, or cellulose-based films, Similarly, the inorganic barrier layer 30 may be selected, without limitation, from aluminum, aluminum oxide, silver, silicon oxide, indium, indium tin oxide (ITO), nickel, gold, metal nitrides (such as aluminum and silicon), oxynitrides (such as aluminum), or metal carbides (such as silicon), as best suited for a particular application. The polymer layer 32 may consist, without limitation, of polyacrylates, polyvinyls, epoxy polymers, polycycloaliphatics, or fluorocarbon polymers. The outer thermoplastic layer 34 may be, without limitation, a polyvinyl acetate, or any polymer from the groups of polybuterates, polyolefin, polyacrylates, polyurethanes, epoxy polymers, polyesters, polycarbonates, polycycloaliphatics, polyvinyl ethers, polyvinyl alcohols, silicones, fluorosilicone polymers, rubbers, or ionic polymers, again based on particular needs or constraints, as may be related to the lamination process. The nano-particles or nano-flakes may consist, without limitation, of alumina, silica, mica, silver, indium, nickel, gold, aluminum suboxide, aluminum oxynitride, titania. Silicon suboxide, silicon carbide, silicon oxynitride, indium zinc oxide or indium tin oxide, or other metal-based particles, preferably less than about 2 microns in average nominal diameter. It is understood that a thermoset polymer containing inorganic nano-particles could also be used to make up the layer 34, but in such case the composite barrier would no longer be suitable for lamination without the use of adhesives, which may not be acceptable for certain applications. Such a thermoset outer layer would have to be prepared by first incorporating the inorganic nano-particles into the liquid monomer, depositing the mixture as a liquid at atmospheric pressure over the vacuum-formed polymeric layer, and then curing the liquid monomer to produce the polymeric thermoset layer.

Figure 7:
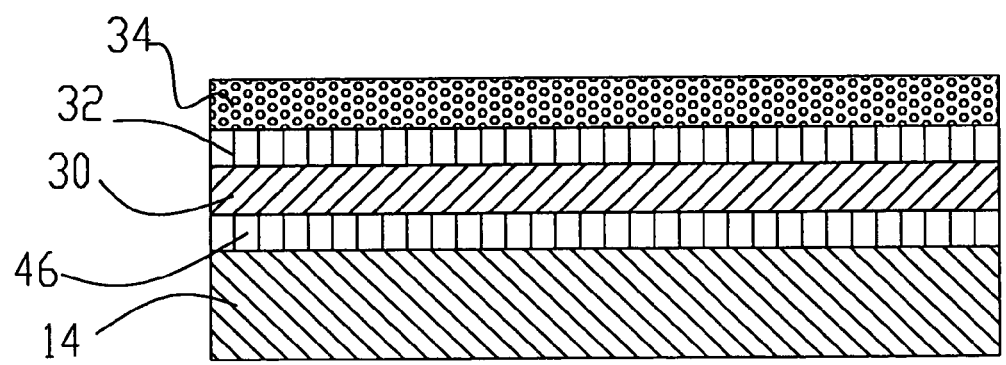
FIG. 7 is a schematic view of another multi-layer structure according to the invention.

It is noted that various combinations of vacuum-deposited inorganic and organic layers and atmospheric-deposited thermoplastic or thermoset layers may be used within the scope of the invention to achieve particular results. For example, an additional radiation-cured polymer layer 46 may be deposited in vacuum over the substrate 14 prior to the deposition of the inorganic layer 30, as illustrated in FIG. 7. This crosslinked layer is used to cover defects on the surface of the polymeric substrate that might interfere with the nucleation and adhesion of the inorganic barrier layer. Such leveling layer preferably consists of a polymer selected from the group consisting of acrylates, vinyl polymers, bicycloaliphatics, diepoxy polymers, fluoropolymers and polysiloxanes, or a combination of them. The leveling layer could also consist of a polymer deposited at atmospheric pressure. The following examples illustrate the invention:

Example 1

FIG. 4

An inorganic barrier layer composed of aluminum oxide was deposited by electron beam evaporation on a 15 micron thick film substrate of polyester in a vacuum deposition chamber at a vacuum level about $10^{-4}$ torr, to form a 200 angstrom of barrier film. A layer of polyvinylidene fluoride thermoplastic polymer was deposited on the aluminum oxide barrier at atmospheric pressure and the one layer barrier sheet structure was measured for moisture barrier. The structure was then laminated onto itself to form a two layer and a four layer barrier sheet. The moisture barrier of the different barrier sheets was as follows:

| Barrier | MVTR, 38° C., 90% RH (g/m$^2$/day) |
| --- | --- |
| One Layer barrier Sheet | 0.3-0.4 |
| Two layer barrier sheet | 0.03 |
| Three layer barrier sheet | <0.001 |

Example 2

An inorganic barrier layer composed of indium tin oxide was deposited by a sputtering process over a 125 micron thick film substrate of polyester in a vacuum deposition chamber at a vacuum level of 30 millitorr to form a 500-angstrom barrier film. The resulting structure was then removed from the vacuum chamber and processed at atmospheric pressure to deposit a nano-composite layer of thermoplastic polyurethane deposited over the barrier layer. The thermoplastic polyurethane resin had previously been prepared by mixing aluminum-oxide nano-particles, less than 100 nm in size, in the liquid polyurethane resin (about 10 grams of particles per 90 grams of resin) and curing the coating to produce the nano-composite laminating barrier layer. The resulting barrier produced the following moisture permeability results, alone and in multiple-layer stacks:

| Barrier | MVTR, 38° C., 90% RH (g/m$^2$/day) |
| --- | --- |
| ITO Barrier Layer only | 0.206 |
| Single barrier sheet of ITO/Nanocomposite layer | 0.10 |
| Three Layer Barrier sheet | <0.001 |

Example 3

FIG. 2

A 0.5-micron thick radiation-cured acrylate polymer layer was deposited in a vacuum chamber on a 50-micron thick polycarbonate film substrate at a pressure of about $5 \times 10^{-4}$ torr. An inorganic barrier layer composed of indium tin oxide was deposited by a sputtering process over the radiation cured polymer layer in a vacuum deposition chamber at a vacuum level of 30 millitorr to form a 500-angstrom barrier film. The resulting structure was removed from the vacuum chamber and processed at atmospheric pressure to deposit a nano-composite layer of thermoplastic polyurethane polymer deposited over the barrier layer. The thermoplastic polyurethane resin had previously been prepared by mixing aluminum-oxide nano-particles, less than 100 nm in size, in the liquid polyurethane resin (about 10 grams of particles per 90 grams of resin) and curing the coating to produce the nano-composite laminating barrier layer. The moisture barrier of the resulting single and double-layer stack yielded the following moisture permeability parameters:

| Barrier | MVTR, 38° C., 90% RH (g/m²/day) |
|---|---|
| Polycarbonate/radiation cured polymer/ITO/nano-composite layer of thermoplastic polyurethane | 0.03 |
| Barrier sheet with two of the above layers | <0.001 |

Example 4

Structure B, FIG. 2

An inorganic barrier layer composed of indium tin oxide was deposited by a sputtering process in a vacuum deposition chamber at a vacuum level of 30 millitorr to form a 500-angstrom barrier film. A 0.5-micron thick radiation-cured acrylate polymer layer was deposited in the vacuum chamber on the inorganic barrier layer at a pressure of about $5 \times 10^{-4}$ torr. The resulting structure was removed from the vacuum chamber and processed at atmospheric pressure to deposit a nano-composite layer of thermoplastic polyurethane polymer deposited over the barrier layer. The thermoplastic polyurethane resin had previously been prepared by mixing aluminum-oxide nano-particles, less than 100 nm in size, in the liquid polyurethane resin (about 10 grams of particles-per 90 grams of resin) and curing the coating to produce the nano-composite laminating barrier layer. The moisture barrier of the resulting single and double-layer stack yielded the following moisture permeability parameters:

| Barrier | MVTR, 38° C., 90% RH (g/m²/day) |
|---|---|
| Polycarbonate/ITO/radiation cured polymer/nano-composite layer of thermoplastic polyurethane | 0.05 |
| Barrier sheet with two of the above layers | <0.001 |

Example 5

FIG. 7

A 0.5-micron thick radiation-cured polymer layer was deposited in a vacuum chamber on a 50-micron thick polycarbonate film substrate at a pressure of about $5 \times 10^{-4}$ torr. An inorganic barrier layer composed of indium tin oxide was deposited by a sputtering process over the radiation cured polymer layer in a vacuum deposition chamber at a vacuum level of 30 millitorr to form a 500-angstrom barrier film. A second radiation cured polymer layer was then deposited in vacuum over the inorganic barrier layer. The resulting structure was then removed from the vacuum chamber and processed at atmospheric pressure to deposit a nano-composite layer of thermoplastic polyurethane polymer deposited over the barrier layer. The thermoplastic polyurethane resin had previously been prepared by mixing aluminum-oxide nano-particles, less than 100 nm in size, in the liquid polyurethane resin (about 10 grams of particles per 90 grams of resin) and curing the coating to produce the nano-composite laminating barrier layer. The resulting structure was then measured for moisture barrier. The moisture barrier of the resulting single and double-layer stack yielded the following moisture permeability parameters:

| Barrier | MVTR, 38° C., 90% RH (g/m²/day) |
|---|---|
| Polycarbonate/radiation cured polymer/ITO radiation cured polymer/nano-composite layer of thermoplastic polyurethane | 0.01 |
| Barrier sheet with two of the above layers | <0.001 |

These results illustrate the improvements produced by the composite barriers of the invention over the prior art and the incremental reduction in permeability yielded by the successive addition of a composite layer to a stack. The functionality of the reduction data can be used to predict the number of layers needed in a stack to produce the desired permeability characteristics. For instance, the barrier of the various structures of Example 2 is particularly suited for the following applications, with the corresponding properties listed below:

| Barrier | MVTR, 38° C., 90% RH (g/m²/day) | Application |
|---|---|---|
| One Layer barrier Sheet | 0.3-0.4 | Food and medical |
| Two layer barrier sheet | 0.03 | Electronic parts, EL, batteries, photovoltage and LCD |
| Three layer barrier sheet | <0.001 | OLED, PLED |

Figure 8:
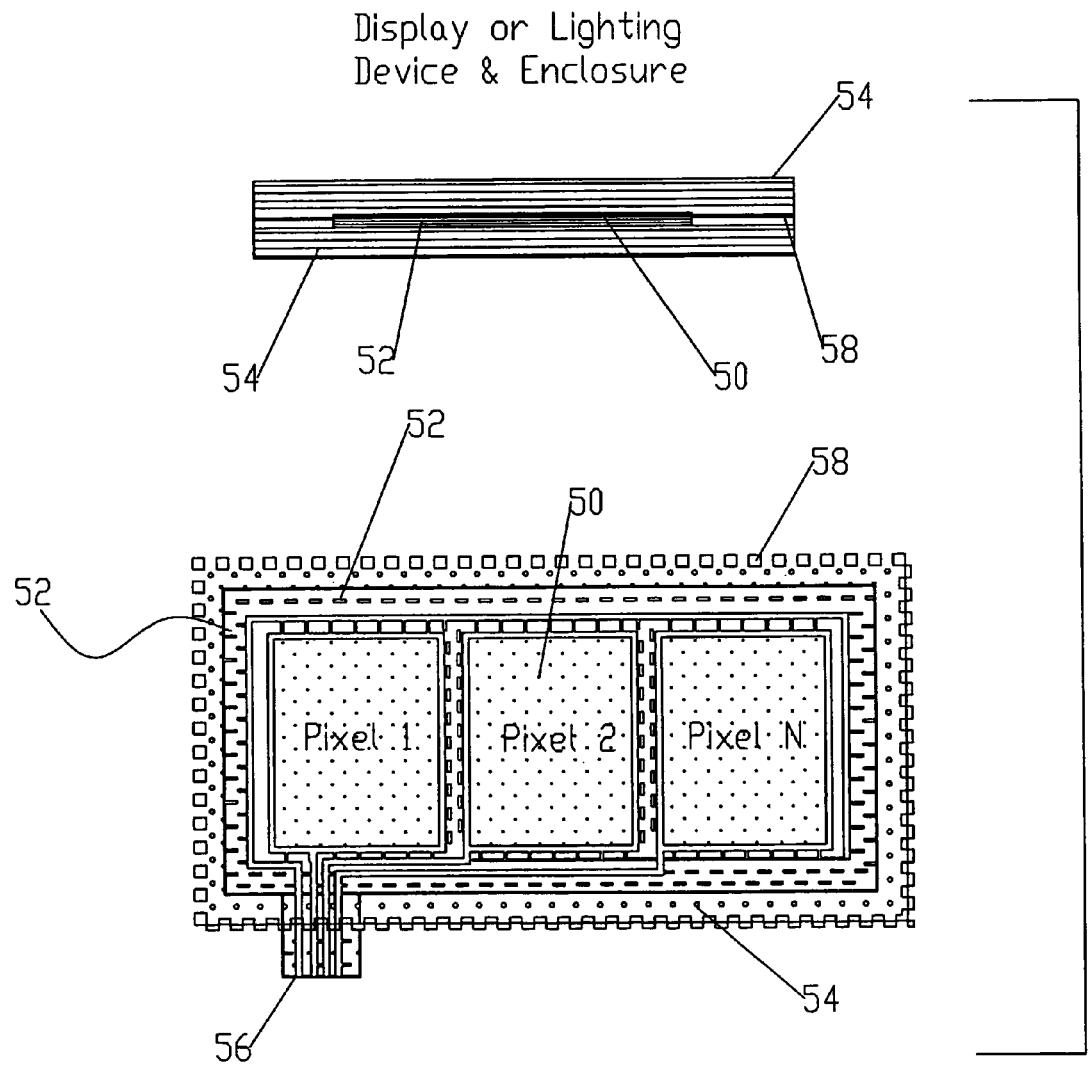
FIG. 8 illustrates in front elevation and in plan views an optical sensor sandwiched between two sheets of a stacked multi-layer barrier structure manufactured according to the invention.

Thus, the transparent barrier structures of the invention can be used advantageously to seal and protect electronic and other devices by a process of lamination that completely encloses the device. Because of the thermoplasticity of the atmospheric barrier layer, the barrier is easily adhered to the surface of the device while permitting electrical leads to emerge from the package for connection to receiving apparatus. Where transparency is important for a particular device, multiple-layer structures with nano-particles may be used on the side of the device requiring optical transmittance, while a conventional opaque barrier may be used on the other side. For example, FIG. 8 illustrates a multi-pixel light source 50

(or, equivalently, a light sensor) supported by a substrate 52 and sandwiched between two sheets of a stacked multi-layer structure 54, wherein at least the top portion of the structure is transparent. The electrical leads 56 of the device 50 are conveniently kept in place by the adhering layers of the barrier material.

Similarly, as illustrated in FIG. 9, an edge seal 58 is formed by the adhesion of the thermoplastic layer in the stacks used to laminate the device. If the device application requires particular structural strength at the edges and avoiding edge separation is crucial to the performance of the device, an edge strip protector 60 may also be installed to frame and encapsulate the package, as shown in the figure.

As indicated above, a desiccant material may also be combined (preferably with the adhering layer of the invention) to promote drying, dehydration or water/moisture trapping. For example, inorganic desiccants such as calcium chloride particles, calcium sulfate particles, or phosphorus pentoxide particles may be used. Water-retaining polymers such as hydrogels may also be used. Such desiccants and polymers in nano-particle form are preferably deposited as a thin layer between the thermoset radiation-cured polymer and the sealing thermoplastic layer. Alternatively, the desiccant or polymer layer may be deposited between the inorganic barrier layer and the sealing thermoplastic layer. FIG. 10 illustrates a hybrid application wherein a top desiccant layer 62 is placed between the device 50 and a transparent multi-layer top stack 54 manufactured according to the invention. A bottom desiccant layer 64 is similarly placed between the bottom stack and the bottom side of the support substrate 52 for the device 50 and may be combined with an opaque polymeric or inorganic layer (such as a conventional barrier layer), if transparency is not required.

Desiccant material 66 may also be packed within the edge protector strips 60, as illustrated in FIG. 11. In such cases, these desiccant materials are also used for improving the seal at the edge. Similarly, the water-retaining polymers can be used as well as binders or as dispersing matrices for the inorganic desiccant powders. The desiccant layer can consist of a very thin layer (less than about 0.1 micron) of inorganic desiccant fine powder applied over another barrier layer, or a thin layer (less than about 2.0 micron) of water-retaining polymer applied over another barrier layer, or desiccant fine-powder or polymer nano-particles blended in the thermoplastic sealing layer (up to about 10-micron thick), or desiccant fine powder nano-particles blended in a water-retaining polymer layer (for example, polyacrylamide or phosphate functionalized polyacrylate also in a layer up to about 10-micron thick) and applied over another barrier layer. Such barriers are illustrated in the following examples.

Example 6

An inorganic barrier layer composed of indium tin oxide was deposited by a sputtering process over a 125 micron film substrate of polyester in a vacuum deposition chamber at a vacuum level of 30 millitorr to form a 500-angstrom barrier film. The resulting structure was removed from the vacuum chamber and processed at atmospheric pressure to deposit a desiccant layer composed of 10% very fine calcium chloride powder in 90% polyacrylamide. After curing, a nano-composite layer of thermoplastic polyurethane polymer was deposited over the desiccant layer. The thermoplastic polyurethane resin had previously been prepared by mixing aluminum-oxide nano-particles, less than 100 nm in size, in liquid polyurethane resin (about 10 grams of particles per 90 grams of resin). The coating was then cured to produce the nano-composite laminating barrier layer. The resulting barrier produced the following moisture permeability results, alone and in multiple-layer stacks:

| Barrier | MVTR, 38° C., 90% RH (g/m²/day) |
| --- | --- |
| ITO Barrier Layer only | 0.206 |
| Single barrier sheet of ITO/desiccant layer/ Nanocomposite layer | 0.01 |
| Three Layer Barrier sheet | <0.001 |

Example 7

A 0.5-micron thick radiation-cured polymer layer was deposited in a vacuum chamber on a 50-micron thick polycarbonate film substrate at a pressure of about 5×10-4 torr. An inorganic barrier layer composed of indium tin oxide was deposited by a sputtering process over the radiation-cured polymer layer in a vacuum deposition chamber at a vacuum level of 30 millitorr to form a 500-angstrom barrier film. A second radiation cured polymer layer was deposited over the inorganic barrier layer. The material was then removed from the vacuum chamber and processed at atmospheric pressure to deposit a desiccant layer composed of 10% very fine calcium chloride powder in 90% polyacrylamide. The moisture permeability of the barrier in the resulting single and double-layer stacks was undetectable.

Example 8

Polymer Desiccant Layer

An inorganic barrier layer composed of indium tin oxide was deposited by a sputtering process in a vacuum deposition chamber at a vacuum level of 30 millitorr to form a 500-angstrom barrier film. A 0.5-micron thick radiation-cured acrylate polymer layer was deposited in the vacuum chamber on the inorganic barrier layer at a pressure of about 5×10-4 torr. The resulting structure was removed from the vacuum chamber and processed at atmospheric pressure to deposit a desiccant layer of crosslinked water retaining polyamide deposited over the first polymer layer. Another nano-composite layer of thermoplastic polyurethane polymer was deposited over the desiccant layer. The thermoplastic polyurethane resin had previously been prepared by mixing aluminum-oxide nano-particles, less than 100 nm in size, in the liquid polyurethane resin (about 10 grams of particles per 90 grams of resin) and curing the coating to produce the nano-composite laminating barrier layer. The moisture barrier of the resulting single and double-layer stack yielded the following moisture permeability parameters:

| Barrier | MVTR, 38° C., 90% RH (g/m²/day) |
| --- | --- |
| Polycarbonate/ITO/ radiation cured polymer/ desiccant polymer/ nano-composite layer of thermoplastic polyurethane | 0.03 |
| Barrier sheet with two of the above layers | <0.001 |

These examples further illustrate the effectiveness of the composite barrier of the invention for different applications. While the vacuum-deposited component of the composite barriers is illustrated throughout mostly as an inorganic-polymeric two-film structure, it is understood that various additional layers could be deposited under vacuum within the scope of the invention. Similarly, the process of stacking the composite barriers using the thermoplastic layer as a binder has been described as a separate operation from the process of manufacture of each single composite barrier, but it could be performed as well by successively repeating the various deposition steps. Moreover, the lamination process using the composite barrier of the invention is preferably conducted under vacuum as well in order to further improve adhesion and eliminate the presence of oxygen from the resulting package. For example, the lamination process may be conducted in vacuum by wrapping two barrier sheets over an article and sealing them in the vacuum chamber, or in atmospheric conditions by introducing a vacuum source (such as a suction tube) within the package formed by the two barrier sheets as the package is being sealed.

Various changes in the details, steps and components that have been described may be made by those skilled in the art within the principles and scope of the invention herein illustrated and defined in the appended claims. For example, FIG. 12 illustrates a combination of a transparent barrier 70 according to the invention (or a conventional transparent barrier) with one of the multi-layer stacks described above, wherein the latter's thermoplastic layer is used to overlap, enclose and seal the device 50 and the barrier 70 from water and moisture permeability. The top side of the device is covered with the transparent barrier 70, which is framed by the multi-layer barrier of the invention 54 along the edges of the package, while the bottom side may be transparent or not, depending on the operational needs of the device. The thermoplastic layer 34 is used to form a seal 72 between the barrier 70 and the barrier 54, while the overlap seals the edges of the package. Alternatively, a conventional opaque barrier could be used below the device and a transparent barrier sheet according to the invention could be folded downward to overlap, enclose and seal in reverse of the structure illustrated in FIG. 12.

Therefore, while the present invention has been shown and described herein in what is believed to be the most practical and preferred embodiments, it is recognized that departures can be made therefrom within the scope of the invention, which is not to be limited to the details disclosed herein but is to be accorded the full scope of the claims so as to embrace any and all equivalent processes and products.

We claim:

1. A flexible and transparent moisture-barrier sheet comprising:
    two or more multilayer substructures sequentially stacked over one another to provide a predetermined moisture-barrier effect, each of said substructures comprising the following layers arranged in the following ordered sequence:
        a flexible substrate film;
        a vacuum-deposited inorganic moisture-barrier layer applied over the substrate film, said inorganic moisture-barrier layer being no more than 1,000 angstroms in thickness; and
        a nano-composite layer applied over the inorganic moisture-barrier layer, said nano-composite layer being transparent to visible light.

2. The moisture-barrier sheet of claim 1, wherein said flexible substrate film comprises a material selected from the group consisting of polyesters, polycarbonates, polyarylites, polyphenylene sulfide, polycycloaliphatics, polyacrylates, polystyrenes, polyurethanes, polyolefins, or cellulose-based films.

3. The moisture-barrier sheet of claim 1, wherein said inorganic moisture-barrier layer comprises a material selected from the group consisting of aluminum, silver, indium, nickel, gold, aluminum oxide, aluminum nitride, aluminum oxynitride, silicon oxides, silicon carbide, silicon nitride, silicon oxynitride, or indium tin oxide.

4. The moisture-barrier sheet of claim 1, wherein said nano-composite layer comprises inorganic nano-particles in a thermoplastic resin.

5. The moisture-barrier sheet of claim 4, wherein said thermoplastic resin comprises a material selected from the group consisting of polyvinyl acetates, polybuterates, polyolefin, polyacrylates, polyurethanes, epoxy polymers, polyesters, polycarbonates, polycycloaliphatics, polyvinyl ethers, polyvinyl alcohols, silicones, fluorosilicone polymers, rubbers, or ionic polymers.

6. The moisture-barrier sheet of claim 4, wherein said nano-particles comprise moisture-barrier nano-particles of a material selected from the group consisting of alumina, silica, mica, silver, indium, nickel, gold, aluminum suboxide, aluminum oxynitride, silicon suboxide, silicon carbide, silicon oxynitride, indium zinc oxide or indium tin oxide.

7. The moisture-barrier sheet of claim 6, wherein said thermoplastic resin comprises a material selected from the group consisting of polyvinyl acetates, polybuterates, polyolefin, polyacrylates, polyurethanes, epoxy polymers, polyesters, polycarbonates, polycycloaliphatics, polyvinyl ethers, polyvinyl alcohols, silicones, fluorosilicone polymers, rubbers, or ionic polymers.

8. The moisture-barrier sheet of claim 4, wherein said nano-particles comprise desiccant nano-particles of a material selected from the group consisting of calcium chloride, calcium sulfate, phosphorus pentoxide, and water-retaining polymers.

9. The moisture-barrier sheet of claim 8, wherein said thermoplastic resin comprises a material selected from the group consisting of polyvinyl acetates, polybuterates, polyolefin, polyacrylates, polyurethanes, epoxy polymers, polyesters, polycarbonates, polycycloaliphatics, polyvinyl ethers, polyvinyl alcohols, silicones, fluorosilicone polymers, rubbers, or ionic polymers.

10. The moisture-barrier sheet of claim 1, wherein said flexible substrate film comprises a material selected from the group consisting of polyesters, polycarbonates, polyarylites, polyphenylene sulfide, polycycloaliphatics, polyacrylates, polystyrenes, polyurethanes, polyolefins, or cellulose-based films; said inorganic moisture-barrier layer comprises a material selected from the group consisting of aluminum, silver, indium, nickel, gold, aluminum oxide, aluminum nitride, aluminum oxynitride, silicon oxides, silicon carbide, silicon nitride, silicon oxynitride, or indium tin oxide; said nano-composite layer comprises moisture-barrier nano-particles in a thermoplastic resin; the moisture-barrier nano-particles include a material selected from the group consisting of alumina, silica, mica, silver, indium, nickel, gold, aluminum suboxide, aluminum oxynitride, silicon suboxide, silicon carbide, silicon oxynitride, indium zinc oxide or indium tin oxide; and the thermoplastic resin comprises a material selected from the group consisting of polyvinyl acetates, polybuterates, polyolefin, polyacrylates, polyurethanes, epoxy polymers, polyesters, polycarbonates, polycycloaliphatics, polyvinyl ethers, polyvinyl alcohols, silicones, fluorosilicone polymers, rubbers, or ionic polymers.

11. A flexible and transparent moisture-barrier sheet comprising:
two or more multilayer substructures sequentially stacked over one another to provide a predetermined moisture-barrier effect, each of said substructures comprising the following layers arranged in the following ordered sequence:
a flexible substrate film;
a vacuum-deposited leveling polymer layer applied over the substrate film;
a vacuum-deposited inorganic moisture-barrier layer applied over the leveling polymer layer, said inorganic moisture-barrier layer being no more than 1,000 angstroms in thickness; and
a nano-composite layer applied over the inorganic moisture-barrier layer, said nano-composite layer being transparent to visible light.

12. The moisture-barrier sheet of claim 11, wherein said flexible substrate film comprises a material selected from the group consisting of polyesters, polycarbonates, polyarylites, polyphenylene sulfide, polycycloaliphatics, polyacrylates, polystyrenes, polyurethanes, polyolefins, or cellulose-based films.

13. The moisture-barrier sheet of claim 11, wherein said leveling polymer layer comprises a polymer selected from the group consisting of polyacrylates, vinyl polymers, bicycloaliphatics, diepoxy polymers, fluoropolymers and polysiloxanes.

14. The moisture-barrier sheet of claim 11, wherein said inorganic moisture-barrier layer comprises a material selected from the group consisting of aluminum, silver, indium, nickel, gold, aluminum oxide, aluminum nitride, aluminum oxynitride, silicon oxides, silicon carbide, silicon nitride, silicon oxynitride, or indium tin oxide.

15. The moisture-barrier sheet of claim 11, wherein said nano-composite layer comprises inorganic nano-particles in a thermoplastic resin.

16. The moisture-barrier sheet of claim 15, wherein said thermoplastic resin comprises a material selected from the group consisting of polyvinyl acetates, polybuterates, polyolefin, polyacrylates, polyurethanes, epoxy polymers, polyesters, polycarbonates, polycycloaliphatics, polyvinyl ethers, polyvinyl alcohols, silicones, fluorosilicone polymers, rubbers, or ionic polymers.

17. The moisture-barrier sheet of claim 15, wherein said nano-particles comprise moisture-barrier nano-particles of a material selected from the group consisting of alumina, silica, mica, silver, indium, nickel, gold, aluminum suboxide, aluminum oxynitride, silicon suboxide, silicon carbide, silicon oxynitride, indium zinc oxide or indium tin oxide.

18. The moisture-barrier sheet of claim 17, wherein said thermoplastic resin comprises a material selected from the group consisting of polyvinyl acetates, polybuterates, polyolefin, polyacrylates, polyurethanes, epoxy polymers, polyesters, polycarbonates, polycycloaliphatics, polyvinyl ethers, polyvinyl alcohols, silicones, fluorosilicone polymers, rubbers, or ionic polymers.

19. The moisture-barrier sheet of claim 15, wherein said nano-particles comprise desiccant nano-particles of a material selected from the group consisting of calcium chloride, calcium sulfate, phosphorus pentoxide, and water-retaining polymers.

20. The moisture-barrier sheet of claim 19, wherein said thermoplastic resin comprises a material selected from the group consisting of polyvinyl acetates, polybuterates, polyolefin, polyacrylates, polyurethanes, epoxy polymers, polyesters, polycarbonates, polycycloaliphatics, polyvinyl ethers, polyvinyl alcohols, silicones, fluorosilicone polymers, rubbers, or ionic polymers.

21. The moisture-barrier sheet of claim 11, wherein said flexible substrate film comprises a material selected from the group consisting of polyesters, polycarbonates, polyarylites, polyphenylene sulfide, polycycloaliphatics, polyacrylates, polystyrenes, polyurethanes, polyolefins, or cellulose-based films; said leveling polymer layer comprises a polymer selected from the group consisting of polyacrylates, vinyl polymers, bicycloaliphatics, diepoxy polymers, fluoropolymers and polysiloxanes; said inorganic moisture-barrier layer comprises a material selected from the group consisting of aluminum, silver, indium, nickel, gold, aluminum oxide, aluminum nitride, aluminum oxynitride, silicon oxides, silicon carbide, silicon nitride, silicon oxynitride, or indium tin oxide; said nano-composite layer comprises moisture-barrier nano-particles in a thermoplastic resin; the moisture-barrier nano-particles include a material selected from the group consisting of alumina, silica, mica, silver, indium, nickel, gold, aluminum suboxide, aluminum oxynitride, silicon suboxide, silicon carbide, silicon oxynitride, indium zinc oxide or indium tin oxide; and the thermoplastic resin comprises a material selected from the group consisting of polyvinyl acetates, polybuterates, polyolefin, polyacrylates, polyurethanes, epoxy polymers, polyesters, polycarbonates, polycycloaliphatics, polyvinyl ethers, polyvinyl alcohols, silicones, fluorosilicone polymers, rubbers, or ionic polymers.

22. A flexible and transparent moisture-barrier sheet comprising:
two or more multilayer substructures sequentially stacked over one another to provide a predetermined moisture-barrier effect, each of said substructures comprising the following layers arranged in the following ordered sequence:
a flexible substrate film;
a vacuum-deposited inorganic moisture-barrier layer applied over the substrate film, said inorganic moisture-barrier layer being no more than 1,000 angstroms in thickness;
a vacuum-deposited polymeric layer applied over said inorganic moisture-barrier layer; and
a nano-composite layer applied over the polymeric layer, said nano-composite layer being transparent to visible light.

23. The moisture-barrier sheet of claim 22, wherein said flexible substrate film comprises a material selected from the group consisting of polyesters, polycarbonates, polyarylites, polyphenylene sulfide, polycycloaliphatics, polyacrylates, polystyrenes, polyurethanes, polyolefins, or cellulose-based films.

24. The moisture-barrier sheet of claim 22, wherein said inorganic moisture-barrier layer comprises a material selected from the group consisting of aluminum, silver, indium, nickel, gold, aluminum oxide, aluminum nitride, aluminum oxynitride, silicon oxides, silicon carbide, silicon nitride, silicon oxynitride, or indium tin oxide.

25. The moisture-barrier sheet of claim 22, wherein said polymeric layer comprises a material selected from the group consisting of polyacrylates, polyvinyls, epoxy polymers, polycycloaliphatics, or fluorocarbon polymers.

26. The moisture-barrier sheet of claim 22, wherein said nano-composite layer comprises inorganic nano-particles in a thermoplastic resin.

27. The moisture-barrier sheet of claim 22, wherein said thermoplastic resin comprises a material selected from the group consisting of polyvinyl acetates, polybuterates, polyolefin, polyacrylates, polyurethanes, epoxy polymers, polyesters, polycarbonates, polycycloaliphatics, polyvinyl ethers, polyvinyl alcohols, silicones, fluorosilicone polymers, rubbers, or ionic polymers.

28. The moisture-barrier sheet of claim 26, wherein said nano-particles comprise moisture-barrier nano-particles of a material selected from the group consisting of alumina, silica, mica, silver, indium, nickel, gold, aluminum suboxide, aluminum oxynitride, silicon suboxide, silicon carbide, silicon oxynitride, indium zinc oxide or indium tin oxide.

29. The moisture-barrier sheet of claim 28, wherein said thermoplastic resin comprises a material selected from the group consisting of polyvinyl acetates, polybuterates, polyolefin, polyacrylates, polyurethanes, epoxy polymers, polyesters, polycarbonates, polycycloaliphatics, polyvinyl ethers, polyvinyl alcohols, silicones, fluorosilicone polymers, rubbers, or ionic polymers.

30. The moisture-barrier sheet of claim 26, wherein said nano-particles comprise desiccant nano-particles of a material selected from the group consisting of calcium chloride, calcium sulfate, phosphorus pentoxide, and water-retaining polymers.

31. The moisture-barrier sheet of claim 30, wherein said thermoplastic resin comprises a material selected from the group consisting of polyvinyl acetates, polybuterates, polyolefin, polyacrylates, polyurethanes, epoxy polymers, polyesters, polycarbonates, polycycloaliphatics, polyvinyl ethers, polyvinyl alcohols, silicones, fluorosilicone polymers, rubbers, or ionic polymers.

32. The moisture-barrier sheet of claim 22, wherein said flexible substrate film comprises a material selected from the group consisting of polyesters, polycarbonates, polyarylites, polyphenylene sulfide, polycycloaliphatics, polyacrylates, polystyrenes, polyurethanes, polyolefins, or cellulose-based films; said inorganic moisture-barrier layer comprises a material selected from the group consisting of aluminum, silver, indium, nickel, gold, aluminum oxide, aluminum nitride, aluminum oxynitride, silicon oxides, silicon carbide, silicon nitride, silicon oxynitride, or indium tin oxide; said polymeric layer comprises a material selected from the group consisting of polyacrylates, polyvinyls, epoxy polymers, polycycloaliphatics, or fluorocarbon polymers; said nano-composite layer comprises moisture-barrier nano-particles in a thermoplastic resin; the moisture-barrier nano-particles include a material selected from the group consisting of alumina, silica, mica, silver, indium, nickel, gold, aluminum suboxide, aluminum oxynitride, silicon suboxide, silicon carbide, silicon oxynitride, indium zinc oxide or indium tin oxide; and the thermoplastic resin comprises a material selected from the group consisting of polyvinyl acetates, polybuterates, polyolefin, polyacrylates, polyurethanes, epoxy polymers, polyesters, polycarbonates, polycycloaliphatics, polyvinyl ethers, polyvinyl alcohols, silicones, fluorosilicone polymers, rubbers, or ionic polymers.

33. A flexible and transparent moisture-barrier sheet comprising:
  two or more multilayer substructures sequentially stacked over one another to provide a predetermined moisture-barrier effect, each of said substructures comprising the following layers arranged in the following ordered sequence:
    a flexible substrate film;
    a vacuum-deposited leveling polymer layer applied over the substrate film;
    a vacuum-deposited inorganic moisture-barrier layer applied over the leveling polymer layer, said inorganic moisture-barrier layer being no more than 1,000 angstroms in thickness;
    a vacuum-deposited polymeric layer applied over said inorganic moisture-barrier layer; and
    a nano-composite layer applied over the inorganic moisture-barrier layer, said nano-composite layer being transparent to visible light.

34. The moisture-barrier sheet of claim 33, wherein said flexible substrate film comprises a material selected from the group consisting of polyesters, polycarbonates, polyarylites, polyphenylene sulfide, polycycloaliphatics, polyacrylates, polystyrenes, polyurethanes, polyolefins, or cellulose-based films.

35. The moisture-barrier sheet of claim 33, wherein said leveling polymer layer comprises a polymer selected from the group consisting of polyacrylates, vinyl polymers, bicycloaliphatics, diepoxy polymers, fluoropolymers and polysiloxanes.

36. The moisture-barrier sheet of claim 33, wherein said inorganic moisture-barrier layer comprises a material selected from the group consisting of aluminum, silver, indium, nickel, gold, aluminum oxide, aluminum nitride, aluminum oxynitride, silicon oxides, silicon carbide, silicon nitride, silicon oxynitride, or indium tin oxide.

37. The moisture-barrier sheet of claim 33, wherein said polymeric layer comprises a material selected from the group consisting of polyacrylates, polyvinyls, epoxy polymers, polycycloaliphatics, or fluorocarbon polymers.

38. The moisture-barrier sheet of claim 33, wherein said nano-composite layer comprises inorganic nano-particles in a thermoplastic resin.

39. The moisture-barrier sheet of claim 38, wherein said thermoplastic resin comprises a material selected from the group consisting of polyvinyl acetates, polybuterates, polyolefin, polyacrylates, polyurethanes, epoxy polymers, polyesters, polycarbonates, polycycloaliphatics, polyvinyl ethers, polyvinyl alcohols, silicones, fluorosilicone polymers, rubbers, or ionic polymers.

40. The moisture-barrier sheet of claim 38, wherein said nano-particles comprise moisture-barrier nano-particles of a material selected from the group consisting of alumina, silica, mica, silver, indium, nickel, gold, aluminum suboxide, aluminum oxynitride, silicon suboxide, silicon carbide, silicon oxynitride, indium zinc oxide or indium tin oxide.

41. The moisture-barrier sheet of claim 40, wherein said thermoplastic resin comprises a material selected from the group consisting of polyvinyl acetates, polybuterates, polyolefin, polyacrylates, polyurethanes, epoxy polymers, polyesters, polycarbonates, polycycloaliphatics, polyvinyl ethers, polyvinyl alcohols, silicones, fluorosilicone polymers, rubbers, or ionic polymers.

42. The moisture-barrier sheet of claim 38, wherein said nano-particles comprise desiccant nano-particles of a material selected from the group consisting of calcium chloride, calcium sulfate, phosphorus pentoxide, and water-retaining polymers.

43. The moisture-barrier sheet of claim 42, wherein said thermoplastic resin comprises a material selected from the group consisting of polyvinyl acetates, polybuterates, polyolefin, polyacrylates, polyurethanes, epoxy polymers, polyesters, polycarbonates, polycycloaliphatics, polyvinyl ethers, polyvinyl alcohols, silicones, fluorosilicone polymers, rubbers, or ionic polymers.

44. The moisture-barrier sheet of claim 33, wherein said flexible substrate film comprises a material selected from the group consisting of polyesters, polycarbonates, polyarylites, polyphenylene sulfide, polycycloaliphatics, polyacrylates, polystyrenes, polyurethanes, polyolefins, or cellulose-based films; said leveling polymer layer comprises a polymer selected from the group consisting of polyacrylates, vinyl polymers, bicycloaliphatics, diepoxy polymers, fluoropolymers and polysiloxanes; said inorganic moisture-barrier layer comprises a material selected from the group consisting of aluminum, silver, indium, nickel, gold, aluminum oxide, aluminum nitride, aluminum oxynitride, silicon oxides, silicon carbide, silicon nitride, silicon oxynitride, or indium tin oxide; said polymeric layer comprises a material selected from the group consisting of polyacrylates, polyvinyls, epoxy polymers, polycycloaliphatics, or fluorocarbon polymers; said nano-composite layer comprises moisture-barrier nano-particles in a thermoplastic resin; the moisture-barrier nano-particles include a material selected from the group consisting of alumina, silica, mica, silver, indium, nickel, gold, aluminum suboxide, aluminum oxynitride, silicon suboxide, silicon carbide, silicon oxynitride, indium zinc oxide or indium tin oxide; and the thermoplastic resin comprises a material selected from the group consisting of polyvinyl acetates, polybuterates, polyolefin, polyacrylates, polyurethanes, epoxy polymers, polyesters, polycarbonates, polycycloaliphatics, polyvinyl ethers, polyvinyl alcohols, silicones, fluorosilicone polymers, rubbers, or ionic polymers.

45. A package for a device with a side requiring exposure to visible light, comprising:
a flexible and transparent moisture-barrier sheet including two or more multilayer substructures sequentially stacked over one another as necessary to provide a predetermined moisture-barrier effect, each of said substructures comprising the following layers arranged in the following ordered sequence:
a flexible substrate film;
a vacuum-deposited inorganic moisture-barrier layer applied over the substrate film, said inorganic moisture-barrier layer being no more than 1,000 angstroms in thickness; and
a nano-composite layer applied over the inorganic moisture-barrier layer, said nano-composite layer being transparent to visible light;
wherein said moisture-barrier sheet is sealingly adhered to said side of the device requiring light exposure so as to encapsulate the device.

46. The package of claim 45, wherein said flexible substrate film comprises a material selected from the group consisting of polyesters, polycarbonates, polyarylites, polyphenylene sulfide, polycycloaliphatics, polyacrylates, polystyrenes, polyurethanes, polyolefins, or cellulose-based films.

47. The package of claim 45, wherein said inorganic moisture-barrier layer comprises a material selected from the group consisting of aluminum, silver, indium, nickel, gold, aluminum oxide, aluminum nitride, aluminum oxynitride, silicon oxides, silicon carbide, silicon nitride, silicon oxynitride, or indium tin oxide.

48. The package of claim 45, wherein said nano-composite layer comprises inorganic nano-particles in a thermoplastic resin.

49. The package of claim 48, wherein said thermoplastic resin comprises a material selected from the group consisting of polyvinyl acetates, polybuterates, polyolefin, polyacrylates, polyurethanes, epoxy polymers, polyesters, polycarbonates, polycycloaliphatics, polyvinyl ethers, polyvinyl alcohols, silicones, fluorosilicone polymers, rubbers, or ionic polymers.

50. The package of claim 48, wherein said nano-particles comprise moisture-barrier nano-particles of a material selected from the group consisting of alumina, silica, mica, silver, indium, nickel, gold, aluminum suboxide, aluminum oxynitride, silicon suboxide, silicon carbide, silicon oxynitride, indium zinc oxide or indium tin oxide.

51. The package of claim 50, wherein said thermoplastic resin comprises a material selected from the group consisting of polyvinyl acetates, polybuterates, polyolefin, polyacrylates, polyurethanes, epoxy polymers, polyesters, polycarbonates, polycycloaliphatics, polyvinyl ethers, polyvinyl alcohols, silicones, fluorosilicone polymers, rubbers, or ionic polymers.

52. The package of claim 48, wherein said nano-particles comprise desiccant nano-particles of a material selected from the group consisting of calcium chloride, calcium sulfate, phosphorus pentoxide, and water-retaining polymers.

53. The package of claim 52, wherein said thermoplastic resin comprises a material selected from the group consisting of polyvinyl acetates, polybuterates, polyolefin, polyacrylates, polyurethanes, epoxy polymers, polyesters, polycarbonates, polycycloaliphatics, polyvinyl ethers, polyvinyl alcohols, silicones, fluorosilicone polymers, rubbers, or ionic polymers.

54. The package of claim 45, further comprising an edge protector strip sealingly coupled to said moisture-barrier sheet.

55. The package of claim 54, further comprising a desiccant material incorporated within the edge protector strip.

56. The package of claim 45, wherein said flexible substrate film comprises a material selected from the group consisting of polyesters, polycarbonates, polyarylites, polyphenylene sulfide, polycycloaliphatics, polyacrylates, polystyrenes, polyurethanes, polyolefins, or cellulose-based films; said inorganic moisture-barrier layer comprises a material selected from the group consisting of aluminum, silver, indium, nickel, gold, aluminum oxide, aluminum nitride, aluminum oxynitride, silicon oxides, silicon carbide, silicon nitride, silicon oxynitride, or indium tin oxide; said nano-composite layer comprises moisture-barrier nano-particles in a thermoplastic resin; the moisture-barrier nano-particles include a material selected from the group consisting of alumina, silica, mica, silver, indium, nickel, gold, aluminum suboxide, aluminum oxynitride, silicon suboxide, silicon carbide, silicon oxynitride, indium zinc oxide or indium tin oxide; and the thermoplastic resin comprises a material selected from the group consisting of polyvinyl acetates, polybuterates, polyolefin, polyacrylates, polyurethanes, epoxy polymers, polyesters, polycarbonates, polycycloaliphatics, polyvinyl ethers, polyvinyl alcohols, silicones, fluorosilicone polymers, rubbers, or ionic polymers.

57. A package for a device with a side requiring exposure to visible light, comprising:
a flexible and transparent moisture-barrier sheet including two or more multilayer substructures sequentially stacked over one another to provide a predetermined moisture-barrier effect, each of said substructures comprising the following layers arranged in the following ordered sequence:
a flexible substrate film;
a vacuum-deposited leveling polymer layer applied over the substrate film;
a vacuum-deposited inorganic moisture-barrier layer applied over the leveling polymer layer, said inorganic moisture-barrier layer being no more than 1,000 angstroms in thickness; and a nano-composite layer applied over the inorganic moisture-barrier layer, said nano-composite layer being transparent to visible light;

wherein said moisture-barrier sheet is sealingly adhered to said side of the device requiring light exposure so as to encapsulate the device.

58. The package of claim 57, wherein said flexible substrate film comprises a material selected from the group consisting of polyesters, polycarbonates, polyarylites, polyphenylene sulfide, polycycloaliphatics, polyacrylates, polystyrenes, polyurethanes, polyolefins, or cellulose-based films.

59. The package of claim 57, wherein said leveling polymer layer comprises a polymer selected from the group consisting of polyacrylates, vinyl polymers, bicycloaliphatics, diepoxy polymers, fluoropolymers and polysiloxanes.

60. The package of claim 57, wherein said inorganic moisture-barrier layer comprises a material selected from the group consisting of aluminum, silver, indium, nickel, gold, aluminum oxide, aluminum nitride, aluminum oxynitride, silicon oxides, silicon carbide, silicon nitride, silicon oxynitride, or indium tin oxide.

61. The package of claim 57, wherein said nano-composite layer comprises inorganic nano-particles in a thermoplastic resin.

62. The package of claim 61, wherein said thermoplastic resin comprises a material selected from the group consisting of polyvinyl acetates, polybuterates, polyolefin, polyacrylates, polyurethanes, epoxy polymers, polyesters, polycarbonates, polycycloaliphatics, polyvinyl ethers, polyvinyl alcohols, silicones, fluorosilicone polymers, rubbers, or ionic polymers.

63. The package of claim 61, wherein said nano-particles comprise moisture-barrier nano-particles of a material selected from the group consisting of alumina, silica, mica, silver, indium, nickel, gold, aluminum suboxide, aluminum oxynitride, silicon suboxide, silicon carbide, silicon oxynitride, indium zinc oxide or indium tin oxide.

64. The package of claim 63, wherein said thermoplastic resin comprises a material selected from the group consisting of polyvinyl acetates, polybuterates, polyolefin, polyacrylates, polyurethanes, epoxy polymers, polyesters, polycarbonates, polycycloaliphatics, polyvinyl ethers, polyvinyl alcohols, silicones, fluorosilicone polymers, rubbers, or ionic polymers.

65. The package of claim 61, wherein said nano-particles comprise desiccant nano-particles of a material selected from the group consisting of calcium chloride, calcium sulfate, phosphorus pentoxide, and water-retaining polymers.

66. The package of claim 65, wherein said thermoplastic resin comprises a material selected from the group consisting of polyvinyl acetates, polybuterates, polyolefin, polyacrylates, polyurethanes, epoxy polymers, polyesters, polycarbonates, polycycloaliphatics, polyvinyl ethers, polyvinyl alcohols, silicones, fluorosilicone polymers, rubbers, or ionic polymers.

67. The package of claim 57, further comprising an edge protector strip sealingly coupled to said moisture-barrier sheet.

68. The package of claim 67, further comprising a desiccant material incorporated within the edge protector strip.

69. The package of claim 57, wherein said flexible substrate film comprises a material selected from the group consisting of polyesters, polycarbonates, polyarylites, polyphenylene sulfide, polycycloaliphatics, polyacrylates, polystyrenes, polyurethanes, polyolefins, or cellulose-based films; said leveling polymer layer comprises a polymer selected from the group consisting of polyacrylates, vinyl polymers, bicycloaliphatics, diepoxy polymers, fluoropolymers and polysiloxanes; said inorganic moisture-barrier layer comprises a material selected from the group consisting of aluminum, silver, indium, nickel, gold, aluminum oxide, aluminum nitride, aluminum oxynitride, silicon oxides, silicon carbide, silicon nitride, silicon oxynitride, or indium tin oxide; said nano-composite layer comprises moisture-barrier nano-particles in a thermoplastic resin; the moisture-barrier nano-particles include a material selected from the group consisting of alumina, silica, mica, silver, indium, nickel, gold, aluminum suboxide, aluminum oxynitride, silicon suboxide, silicon carbide, silicon oxynitride, indium zinc oxide or indium tin oxide; and the thermoplastic resin comprises a material selected from the group consisting of polyvinyl acetates, polybuterates, polyolefin, polyacrylates, polyurethanes, epoxy polymers, polyesters, polycarbonates, polycycloaliphatics, polyvinyl ethers, polyvinyl alcohols, silicones, fluorosilicone polymers, rubbers, or ionic polymers.

* * * * *